United States Patent
Sakamoto et al.

(10) Patent No.: US 9,947,896 B2
(45) Date of Patent: Apr. 17, 2018

(54) DISPLAY DEVICE

(71) Applicant: Japan Display Inc., Tokyo (JP)

(72) Inventors: Shigeru Sakamoto, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/260,372

(22) Filed: Sep. 9, 2016

(65) Prior Publication Data
US 2017/0077448 A1    Mar. 16, 2017

(30) Foreign Application Priority Data
Sep. 14, 2015  (JP) ................................. 2015-180686

(51) Int. Cl.
*H01L 51/52* (2006.01)
*H01L 27/32* (2006.01)

(52) U.S. Cl.
CPC ...... *H01L 51/5253* (2013.01); *H01L 51/5203* (2013.01); *H01L 51/5234* (2013.01);
(Continued)

(58) Field of Classification Search
CPC ....... H01L 27/32; H01L 51/52; H01L 27/322; H01L 51/5203; H01L 51/5296; H01L 51/5253; H01L 51/5278; H01L 27/3211; H01L 27/3246; H01L 27/3248; H01L 27/1214

See application file for complete search history.

(56) References Cited

U.S. PATENT DOCUMENTS

2003/0146693 A1*  8/2003  Ishihara ............. H01L 27/3276
                                                      313/504
2006/0158095 A1*  7/2006  Imamura ............ H01L 27/3279
                                                      313/500
(Continued)

FOREIGN PATENT DOCUMENTS

JP    2009-094347 A    4/2009
JP    2009-128671 A    6/2009
(Continued)

OTHER PUBLICATIONS

Taiwanese Office Action dated Feb. 21, 2017 for corresponding TW Patent Application No. 105123468, With Translation.
(Continued)

*Primary Examiner* — Thanh T Nguyen
(74) *Attorney, Agent, or Firm* — Typha IP LLC

(57) ABSTRACT

A display device includes: pixel electrodes corresponding to pixels; an insulating layer provided so as to overlie peripheral edge portions of the pixel electrodes; a light-emitting layer provided so as to be stacked on and in contact with each of the pixel electrodes; a first common electrode stacked on the light-emitting layer so as to be in contact therewith and provided so as to overlie the insulating layer; a light transmissive layer stacked on the first common electrode above the pixel electrodes, the light transmissive layer avoiding stacking thereof on the first common electrode above the insulating layer; and a second common electrode stacked on the light transmissive layer above the pixel electrodes and stacked on the first common electrode so as to be in contact therewith above the insulating layer.

10 Claims, 10 Drawing Sheets

(52) U.S. Cl.
CPC ........ *H01L 51/5275* (2013.01); *H01L 27/322* (2013.01); *H01L 27/3246* (2013.01); *H01L 27/3248* (2013.01); *H01L 27/3265* (2013.01); *H01L 51/5218* (2013.01); *H01L 51/5237* (2013.01); *H01L 2251/5315* (2013.01)

(56) References Cited

U.S. PATENT DOCUMENTS

| | | | |
|---|---|---|---|
| 2006/0158108 A1* | 7/2006 | Hayashi | H01L 51/5253 313/506 |
| 2007/0183502 A1* | 8/2007 | Haskell | H04N 19/52 375/240.16 |
| 2009/0096371 A1 | 4/2009 | Matsudate et al. | |

FOREIGN PATENT DOCUMENTS

| | | |
|---|---|---|
| JP | 2009-186657 A | 8/2009 |
| KR | 10-2004-0051524 A | 6/2004 |
| KR | 10-2011-0016402 A | 2/2011 |
| KR | 10-2014-0050933 A | 4/2014 |
| TW | I228686 B | 3/2005 |
| TW | I277919 B | 4/2007 |
| TW | I283378 B | 7/2007 |
| TW | 201431061 A | 8/2014 |

OTHER PUBLICATIONS

Korean Office Action dated Aug. 17, 2017, for corresponding KR Patent Application No. 10-2016-0116151.

* cited by examiner

DISPLAY DEVICE

CROSS-REFERENCE TO RELATED APPLICATION

The present application claims priority from Japanese application JP2015-180686 filed on Sep. 14, 2015, the content of which is hereby incorporated by reference into this application.

BACKGROUND OF THE INVENTION

1. Field of the Invention

The present invention relates to a display device in which electroluminescence (EL) elements, organic EL elements, or other light-emitting elements that are self-emitting type display elements are mounted.

2. Description of the Related Art

In a display device including an organic EL display device, a light-emitting element is formed of a pixel electrode individually disposed in each of pixels, a common electrode disposed on the upper side of the pixel electrode so as to be common to the pixels, and a light-emitting layer interposed between the pixel electrode and the common electrode.

In JP 2009-094347 A, it is described to realize a top-emission type organic EL display device in which a voltage drop of an upper electrode is prevented and the luminance of a screen is uniform.

For the common electrode of a light-emitting display device, it is conceivable that the thickness of the common electrode is increased to achieve its lower resistance, and thus the occurrence of shading or a drive voltage is reduced.

However, the increased thickness of the common electrode causes internal stress, so that a crack is likely to occur in the common electrode or the light-emitting layer. Moreover, the time for a deposition step is increased, so that damage to the light-emitting layer or the like may be increased.

SUMMARY OF THE INVENTION

In view of the problems described above, it is an object of the invention to provide a display device in which the lower resistance of a common electrode is achieved while suppressing the occurrence of a crack or deposition damage.

In view of the problems described above, a display device according to an aspect of the invention includes: a plurality of pixel electrodes corresponding to a plurality of unit pixels constituting an image; an insulating layer provided so as to overlie peripheral edge portions of the plurality of pixel electrodes; a light-emitting layer stacked on the plurality of pixel electrodes so as to be in contact with each of the plurality of pixel electrodes; a first common electrode stacked on the light-emitting layer so as to be in contact therewith above the plurality of pixel electrodes, the first common electrode being provided so as to overlie the insulating layer; a light transmissive layer stacked on the first common electrode above the plurality of pixel electrodes, the light transmissive layer avoiding stacking thereof on a portion of the first common electrode above the insulating layer; and a second common electrode stacked on the light transmissive layer above the plurality of pixel electrodes and stacked on the first common electrode so as to be in contact therewith above the insulating layer.

DETAILED DESCRIPTION OF THE INVENTION

Hereinafter, an organic EL display device according to each embodiment of the invention will be described with reference to the drawings.

First Embodiment

Figure 1:
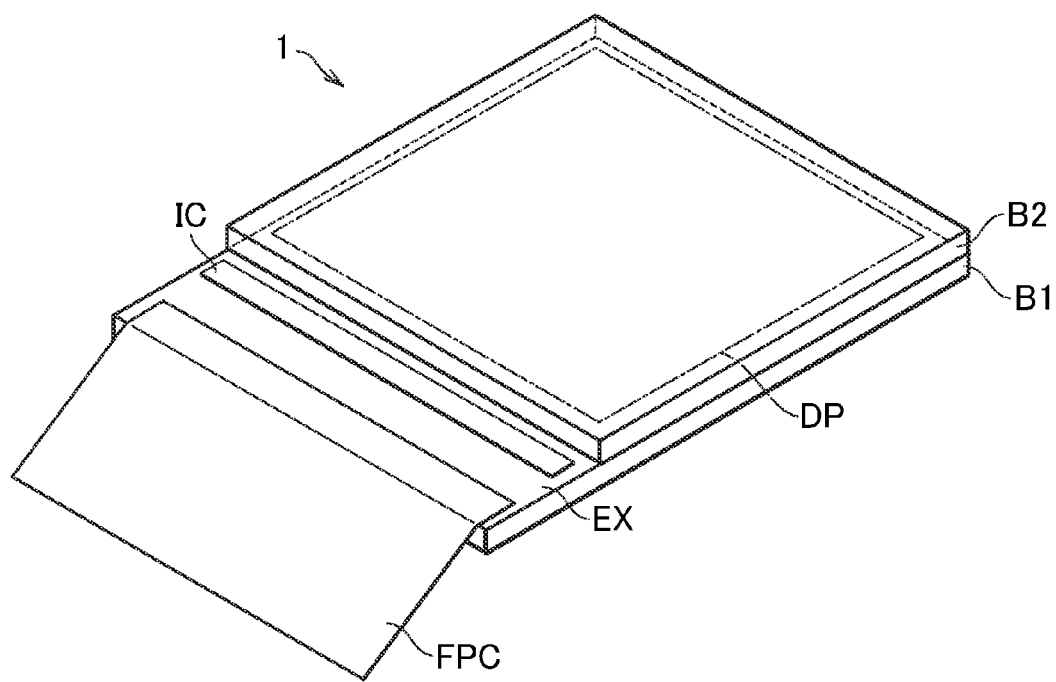
FIG. 1 is a perspective view of a light-emitting display device according to a first embodiment.

FIG. 1 is a schematic perspective view for explaining an organic EL display device 1 as a light-emitting display device of a first embodiment. The organic EL display device 1 of the embodiment includes a first substrate B1 on which organic electroluminescence elements as a plurality of light-emitting elements are disposed, and a second substrate B2 bonded to the first substrate B1. In an area (exposed area EX) of the first substrate B1 exposed from the second substrate B2, a driver semiconductor device IC for driving the organic EL display device 1 is disposed. Further, a flexible printed board FPC is disposed in the vicinity of the edge of the exposed area EX of the first substrate B1.

Figure 2:
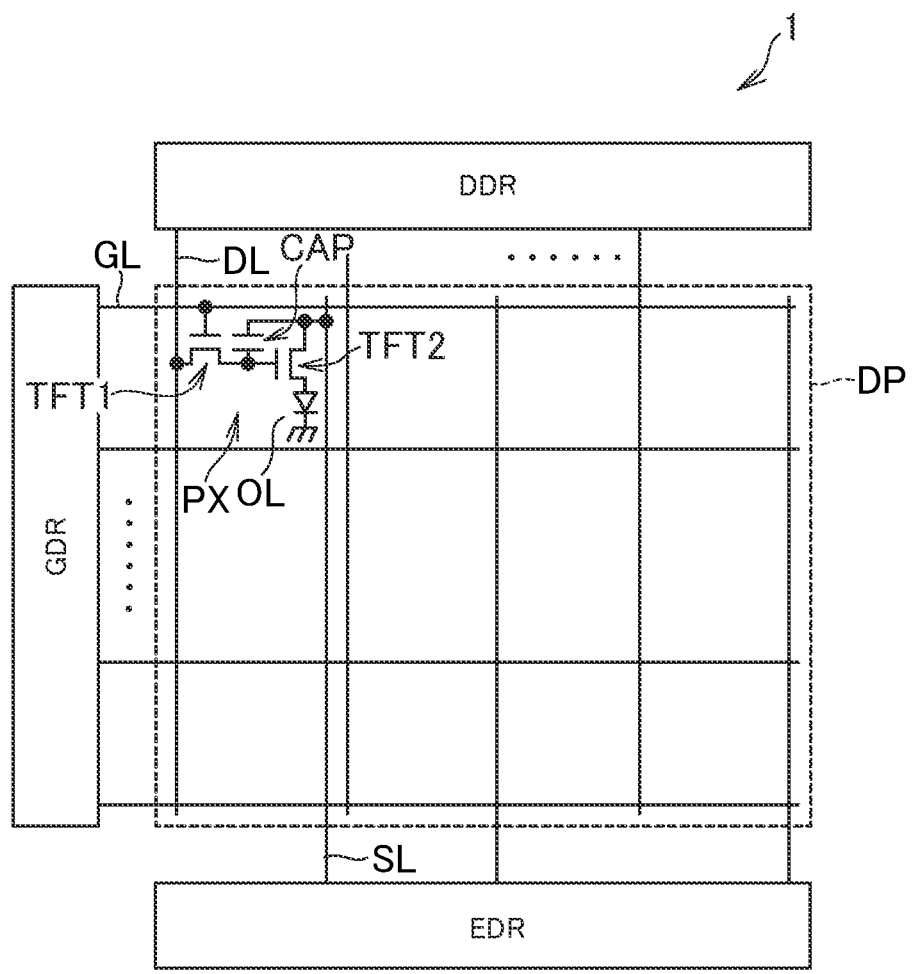
FIG. 2 is a schematic view showing a pixel circuit of the light-emitting display device in the first embodiment.

FIG. 2 is a diagram showing a pixel circuit in a display area DP of the organic EL display device 1 of the first embodiment. The organic EL display device 1 includes the display area DP where an image is displayed, a scanning signal line drive unit GDR, a video signal line drive unit DDR, and a power source drive unit EDR.

In the display area DP, organic electroluminescence elements OL and pixel circuits PX are disposed in a matrix corresponding to a plurality of pixels. The pixel circuit PX includes a thin film transistor TFT1, a capacitive element CAP, and a thin film transistor TFT2. The scanning signal line drive unit GDR, the video signal line drive unit DDR, and the power source drive unit EDR drive the pixel circuits PX to control the emission of the organic electroluminescence elements OL.

The scanning signal line drive unit GDR is connected to scanning signal lines GL each provided for an array of pixels (pixel row) in the horizontal direction, and outputs a scanning signal to the scanning signal lines GL sequentially selected.

The video signal line drive unit DDR is connected to video signal lines DL each provided for an array of pixels (pixel column) in the vertical direction, and outputs, in synchronization with the selection of the scanning signal line GL by the scanning signal line drive portion GDR, a voltage in response to a video signal of the selected pixel row to each of the video signal lines DL. The voltage is written to a capacitor in the pixel circuit PX, and a current in response to the written voltage is supplied to the organic electroluminescence element OL.

The power source drive unit EDR is connected to drive power source lines SL each provided for the pixel column, and supplies a current to the organic electroluminescence element OL through a switching element in the pixel circuit PX.

As will be described later, the organic electroluminescence element OL includes common electrodes (cathodes) separated into two layers, and these common electrodes are both connected to the ground potential.

Figure 3:
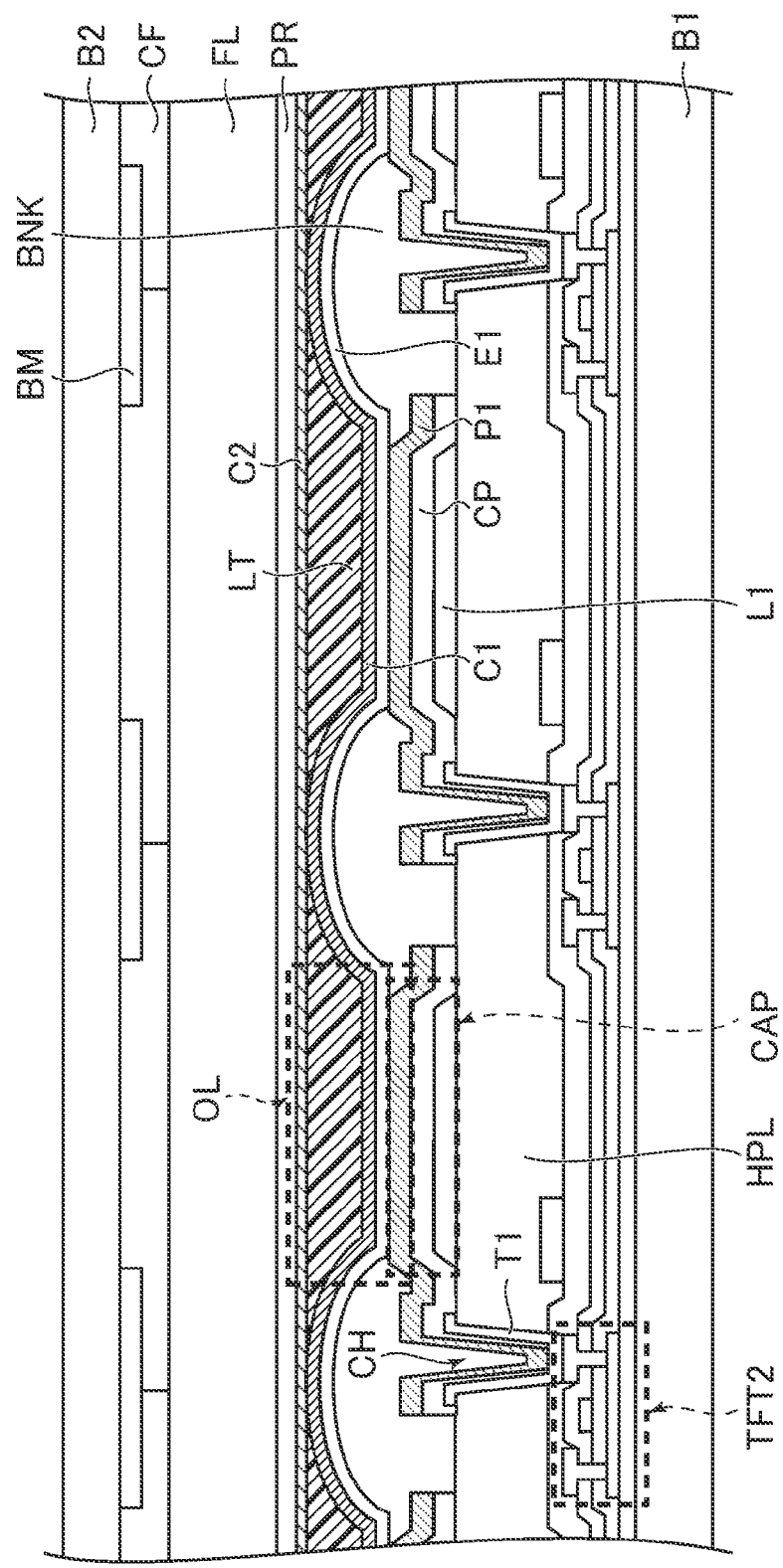
FIG. 3 is a cross-sectional view for explaining one pixel of the light-emitting display device in the first embodiment.

FIG. 3 is a diagram for explaining a cross-section of a pixel in the organic EL display device 1 of the first embodiment. As shown in the drawing, the organic EL display device 1 is configured to include: the first substrate B1 on which the plurality of organic electroluminescence elements OL are formed; the second substrate B2 which is disposed to face the first substrate B1 and on which a color filter layer CF and a black matrix BM are formed; and a filling layer FL filled between the first substrate B1 and the second substrate B2.

Especially here, the organic electroluminescence element OL is configured to include a pixel electrode P1, a light-emitting layer E1, a first common electrode C1, and a second common electrode C2. Between the two common electrodes, a light transmissive layer LT formed of an organic insulating film is interposed. The two common electrodes are in contact (electrically continuous) with each other on the upper side of a bank layer BNK that is formed of an organic insulating film (resin) for separating the pixels. Since the common electrodes are separated into two layers and stacked with the organic insulating film therebetween, the lower resistance of the entire common electrode is achieved while reducing the occurrence of a crack or deposition damage. The two common electrodes will be described in further detail later.

The pixel electrode P1 (anode) of the organic electroluminescence element OL is formed of high-reflective metal such as aluminum, and extends to the bottom portion of a contact hole CH to be connected to a transparent conductive layer T1. The pixel electrode P1 is electrically continuous with a source electrode of the thin film transistor TFT2 formed below a planarizing layer HPL. The bank layer BNK is provided so as to overlie the peripheral edge portion of the pixel electrode P1.

The light-emitting layer E1 in the embodiment is formed between the common electrode C1 and the pixel electrode P1, and configured to include a hole transport layer, a light-emitting layer, and an electron transport layer. In the light-emitting layer in the light-emitting layer E1, holes injected from the pixel electrode P1 stacked on the light-emitting layer E1 so as to be in contact therewith are recombined with electrons injected from the common electrode C1 to thereby emit light. All of the layers constituting the light-emitting layer E1 may be formed over the entire display area DP, or may be formed individually for each of the pixels. The luminance of the light-emitting layer of the organic electroluminescence element OL is controlled by a current from the thin film transistor TFT2.

Here, the first common electrode C1 and the second common electrode C2 are formed of a transparent conductive film of indium tin oxide (ITO) or the like, and serve as an electrode formed in a solid form in a layer common to the plurality of pixels in the display area DP. The light transmissive layer LT formed of an organic insulating film is formed between the first common electrode C1 and the second common electrode C2, in a recess (a portion where the light-emitting layer is formed flat) formed by the bank layer BNK. The two common electrodes are separated by the light transmissive layer LT. The light transmissive layer LT is provided so as to avoid stacking thereof on a portion of the first common electrode C1 above the bank layer BNK. The second common electrode C2 is stacked on the first common electrode so as to be in contact therewith at a place where the light transmissive layer LT is not formed above the bank layer BNK. The light transmissive layer LT is desirably configured of a material that blocks ultraviolet rays and transmits visible light rays. This configuration suppresses damage to the light-emitting layer E1, which may occur when the filling layer FL is cured with ultraviolet rays.

The lower resistance of the entire common electrode is achieved with the second common electrode C2, and further, when depositing the second common electrode C2, deposition damage is reduced because the light-emitting layer E1 is separated by the light transmissive layer LT. Moreover, since the lower resistance is achieved with the second common electrode C2, the first common electrode C1 can be formed thin, and thus the breakage of the light-emitting layer E1 or the like due to a crack is prevented. The first common electrode C1 is desirably formed thinner than the second common electrode C2.

A wiring layer L1 for forming the capacitive element CAP and a capacitive insulating layer CP are disposed under the pixel electrode P1. The capacitive insulating layer CP is formed of, for example, an inorganic insulating film of silicon nitride (SiNx) or the like. The planarizing layer HPL formed of an organic insulating film of acrylic resin, polyimide resin, or the like is formed as the base of the organic electroluminescence element OL and the capacitive element CAP.

The organic electroluminescence elements OL of the pixels are covered and protected by a sealing layer PR. The sealing layer PR in the embodiment is configured mainly of an inorganic insulating film, and specifically, the sealing layer PR is configured to include a silicon nitride layer and a silicon oxide layer.

Figure 4:
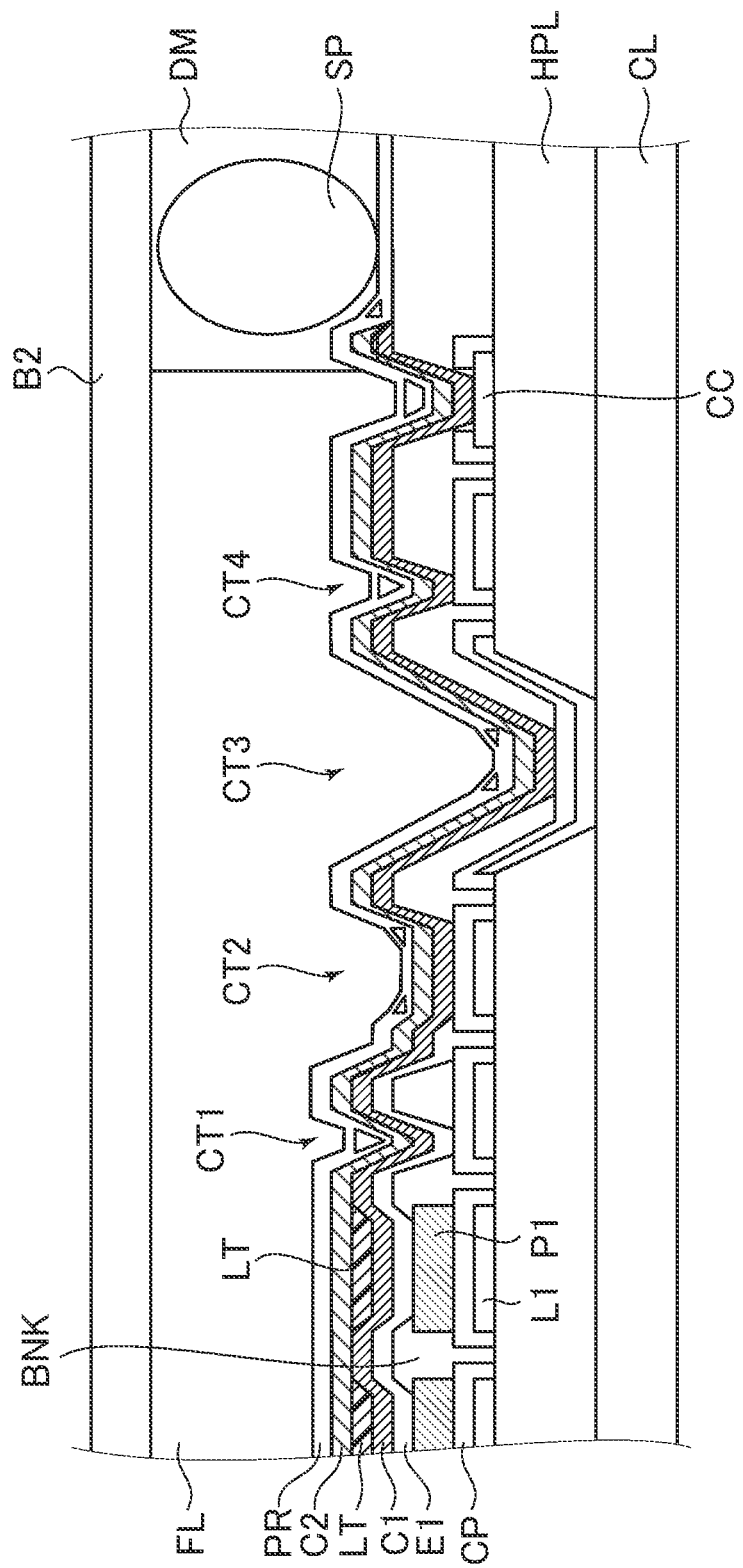
FIG. 4 is a cross-sectional view for explaining a pixel and a picture-frame area of the light-emitting display device in the first embodiment.

FIG. 4 is a cross-sectional schematic view of a pixel and a picture-frame area of the organic EL display device 1 in the first embodiment. As shown in FIG. 4, structures CT1 to CT4 that divide the planarization film HPL and the bank layer BNK are disposed outside the display area DP. In the structure CT3, a groove that reaches an inorganic insulating film of a circuit-constituting layer CL serving as the base of the planarization film HPL is formed, and an inorganic insulating film and a metal layer are formed inside the groove. With this configuration, moisture is prevented from entering the light-emitting layer E1 through the planarization film HPL and the like on the inside. In the vicinity of a sealing material DM containing spacer particles SP, which is further outside the structures CT1 to CT4, a cathode contact CC for supplying a predetermined potential to the first common electrode C1 and the second common electrode C2 is disposed.

The sealing layer PR in the embodiment includes an organic insulating film in addition to two layers of inorganic insulating films, a silicon nitride layer and a silicon oxide/silicon nitride layer. Although voids SM are likely to be formed during stacking the sealing layer PR because a depression is large at the structures CT1 to CT4 or the cathode contact CC, the organic insulating film is filled between the two layers of inorganic insulating films, and thus the occurrence of the voids SM is prevented. Since no voids SM occur, the silicon nitride layer on the upper layer side is conformally formed, and thus the entry of moisture or oxygen can be effectively prevented.

Figure 5A:
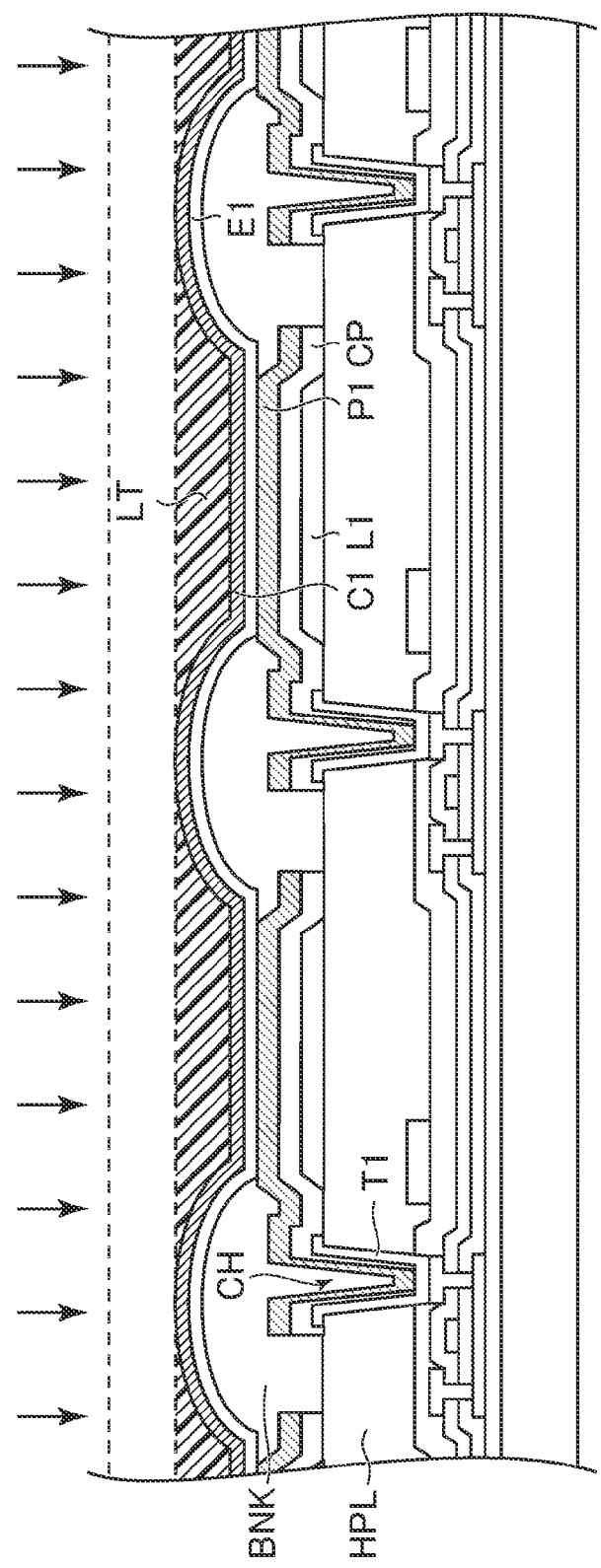
FIG. 5A is a diagram for explaining a step of forming a light transmissive layer in the first embodiment.

FIG. 5A is a diagram for explaining a step of forming the light transmissive layer LT in the embodiment. As shown in the drawing, in the forming step of the light transmissive layer LT in the embodiment, an organic insulating film made of resin is formed so as to entirely cover the display area DP, and then, the organic insulating film is dry etched until the first common electrode C1 above the bank layer BNK is exposed. The upper surface of the light transmissive layer LT becomes nearly flat by etching the light transmissive layer LT as in FIG. 5A, so that the second common electrode C2 is also formed so as to be substantially flat.

Figure 5B:
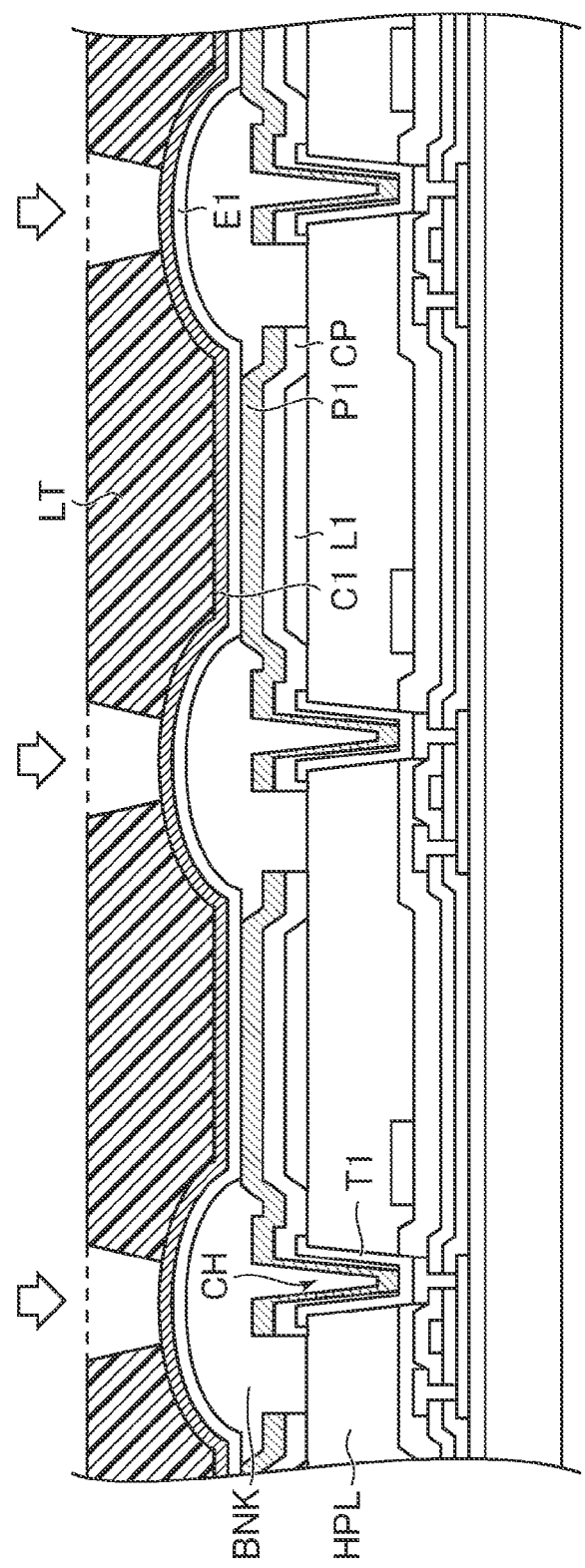
FIG. 5B is a diagram for explaining a step of forming a light transmissive layer in a modified example of the first embodiment.

FIG. 5B is a diagram for explaining a step of forming the light transmissive layer LT in a modified example of the embodiment. As shown in the drawing, in the forming step of the light transmissive layer LT in the modified example, an organic insulating film made of resin is formed so as to entirely cover the display area DP, and then, a laser is locally radiated to the bank layer BNK to reliably expose the first common electrode C1. Thereafter, the second common electrode C2 is stacked, so that the first common electrode C1 and the second common electrode C2 are in reliable contact with each other above the bank layer BNK, and thus the lower resistance of the common electrode is achieved in the same manner as in FIG. 5A.

Second Embodiment

Next, a second embodiment of the invention will be described with reference to FIG. 6. As shown in the drawing, the upper surface of a light transmissive layer LT in a light-emitting display device 1 in the second embodiment is formed to include convex areas each of which is formed so as to be convex in the direction of a second common electrode C2. In other words, the light transmissive layer LT is formed so as to be convex upward (formed in a convex lens shape) such that the inclination gradually increases as the light transmissive layer LT approaches the bank layer BNK. Moreover, the second common electrode C2 and a sealing layer PR located above the light transmissive layer LT are also formed in a shape similar to the upper surface of the light transmissive layer LT. The light-emitting display device 1 of the second embodiment differs from the light-emitting display device 1 in the first embodiment in these respects.

Figure 6:
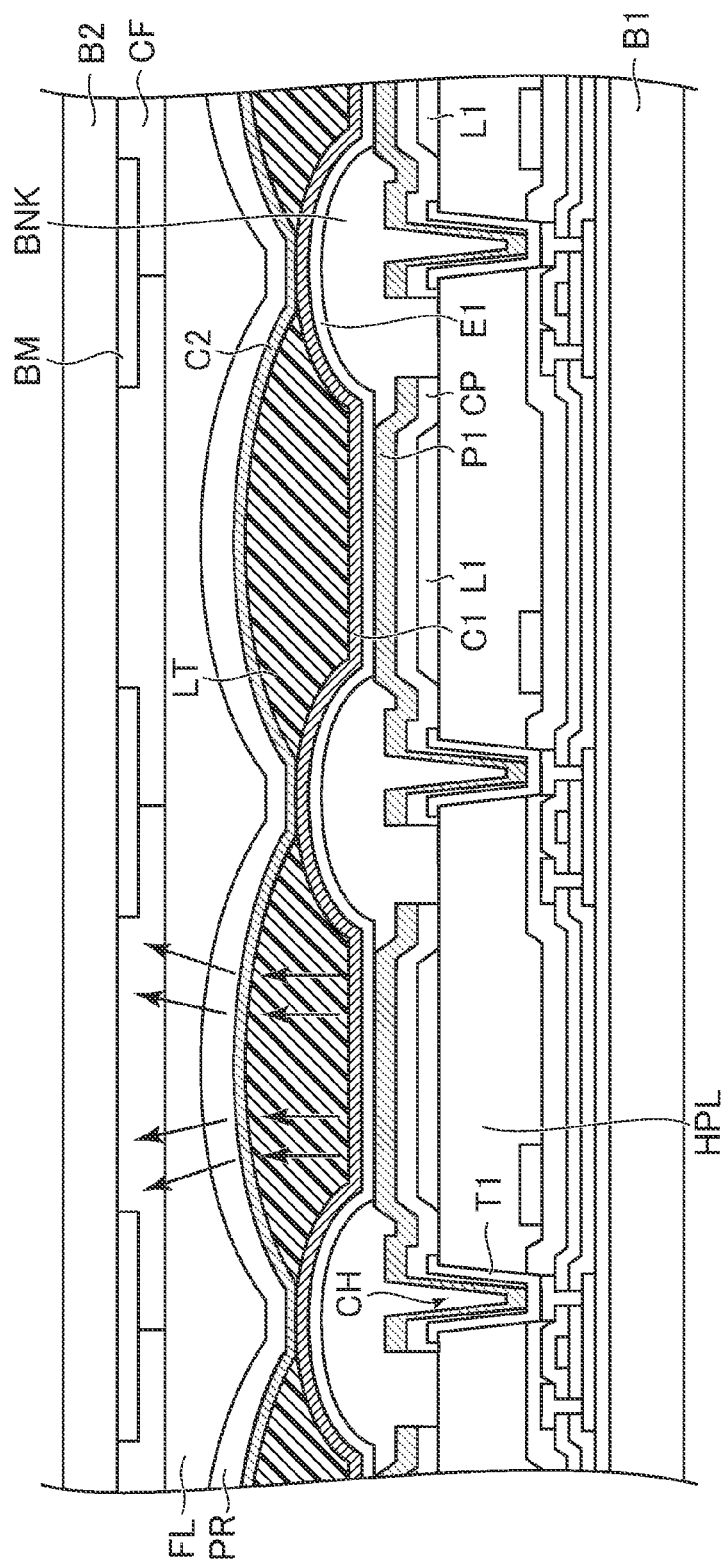
FIG. 6 is a cross-sectional view for explaining one pixel of a light-emitting display device in a second embodiment.

Moreover, since the light transmissive layer LT is formed as shown in FIG. 6, light emitted in the front direction is refracted to thereby improve a viewing angle. When the refractive index of the light transmissive layer LT is smaller than the refractive index of a filling layer FL, the light emitted in the front direction is refracted so as to spread outward like arrows in the left pixel in FIG. 6; while when the refractive index of the filling layer FL is smaller than the refractive index of the light transmissive layer LT, the light emitted in the front direction is refracted so as to be collected inward, opposite to the arrows in the left pixel in FIG. 6. However, even when the refractive index of the filling layer FL is smaller, the emitted light propagates so as to spread outward after being collected inward. In any case, therefore, the light emitted in the front direction propagates so as to spread outward, thereby improving a viewing angle.

As a step of processing the light transmissive layer LT shown in FIG. 6, conditions of the laser radiation, which is described with reference to FIG. 5B, to expose a portion above the bank layer BNK may be appropriately set. With such setting, the light transmissive layer LT can be processed into a convex lens shape.

Moreover, a first common electrode C1 may be semi-transmissive/semi-reflective, extremely thin metal (e.g., silver, Mg, MgAg, etc.), and the second common electrode C2 may be a transparent metal oxide film of ITO or the like. With this configuration, a microcavity effect is promoted between a pixel electrode P1 and the first common electrode C1, while the microcavity effect is suppressed between the first common electrode C1 and the second common electrode C2. Since the light transmissive layer LT has a lens shape, it is desirable to suppress the microcavity effect between the first common electrode C1 and the second common electrode C2. In the embodiment, the first common electrode C1 formed of semi-transmissive/semi-reflective, extremely thin metal has a lower transmittance and a higher reflectance than the second common electrode C2 formed of a transparent metal oxide film of ITO or the like. When the first common electrode C1 is semi-reflective, extremely thin metal and the second common electrode C2 is a transparent metal oxide film as described above, it is preferred for the light-emitting layer E1 to employ a method in which the light-emitting layer E1 is separately colored in red, green, and blue. In this case, it is preferred that no color filter layer CF is present, and instead, it is preferred that a circular polarizer or a touch panel is provided. Further, in relation to emission wavelength, the thickness of the light-emitting layer E1 of the organic electroluminescence element OL that performs red light emission is thicker than the thickness of the light-emitting layer E1 of the organic electroluminescence element OL that performs green light emission, and the thickness of the light-emitting layer E1 of the organic electroluminescence element OL that performs green light emission is thicker than the thickness of the light-emitting layer E1 of the organic electroluminescence element OL that performs blue light emission. With the thickness relationship described above, a distance between the first common electrode C1 and the pixel electrode P1 of the organic electroluminescence element OL that performs red light emission is greater than a distance between the first common electrode C1 and the pixel electrode P1 of the organic electroluminescence element OL that performs green light emission. Likewise, the distance between the first common electrode C1 and the pixel electrode P1 of the organic electroluminescence element OL that performs green light emission is greater than a distance between the first common electrode C1 and the pixel electrode P1 of the organic electroluminescence element OL that performs blue light emission. With the distance relationship described above, the microcavity effect can be effectively obtained. When the organic electroluminescence element OL performs white light emission, the film thickness of the light-emitting layer E1 needs to be changed for red, green, and blue in the form described above for obtaining the microcavity effect, and thus a fine mask, which is originally unnecessary for white light emission, is needed. In the case of the method in which the light-emitting layers E1 is separately colored in red, green, and blue, since the light-emitting layers E1 originally need to be separately fabricated using fine masks for the respective colors, the manufacturing cost is not especially increased, and thus this embodiment is effective. Since the thickness of semi-reflective, extremely thin metal is thinner than that of a transparent metal oxide film, the semi-reflective, extremely thin metal causes less damage to the light-emitting layer E1. This is because the semi-reflective, extremely thin metal is thin and thus readily formed by sputtering or the like, so that the semi-reflective, extremely thin metal causes less damage to the light-emitting layer E1. In the case of the transparent metal oxide film, since the light transmissive layer LT is present, damage is absorbed by the light transmissive layer LT even if the transparent metal oxide film is formed by sputtering or the like for a certain long time. Therefore, emission characteristics of the organic electroluminescence element OL are favorable.

The light-emitting display device 1 in the second embodiment differs from the light-emitting display device 1 in the first embodiment in the respects described above. However, the light-emitting display device 1 in the second embodiment has substantially similar configurations except for the respects, and a description of the configurations substantially similar to those of the first embodiment is omitted.

Third Embodiment

Next, a third embodiment of the invention will be described with reference to FIG. 7. As shown in the drawing, the upper surface of a light transmissive layer LT in a light-emitting display device 1 in the third embodiment is formed to include concave areas each of which is formed so as to be concave in the direction of the second common electrode C2. In other words, the light transmissive layer LT is formed so as to be concave upward (formed in a concave lens shape) such that the inclination gradually increases as the light transmissive layer LT approaches a bank layer BNK. Moreover, a second common electrode C2 and a sealing layer PR located above the light transmissive layer LT are also formed in a shape similar to the upper surface of the light transmissive layer LT. The light-emitting display device 1 of the third embodiment differs from the light-emitting display device 1 in the first embodiment in these respects.

Figure 7:
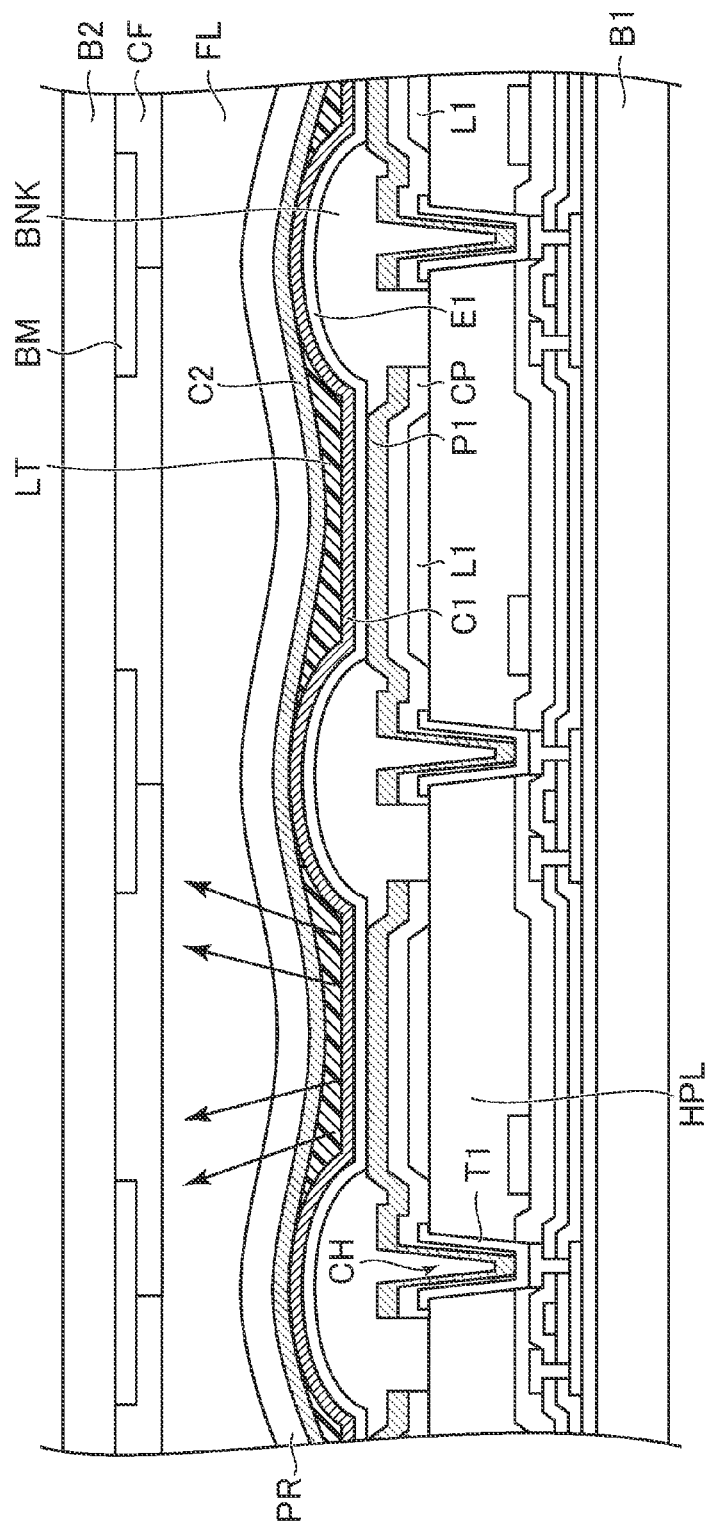
FIG. 7 is a cross-sectional view for explaining one pixel of a light-emitting display device in a third embodiment.

Moreover, since the light transmissive layer LT is formed as shown in FIG. 7, light emitted in the front direction is refracted to thereby improve a viewing angle. When the refractive index of a filling layer FL is smaller than the refractive index of the light transmissive layer LT, the light emitted in the front direction is refracted so as to spread outward like arrows in the left pixel in FIG. 7; while when the refractive index of the light transmissive layer LT is smaller than the refractive index of the filling layer FL, the light emitted in the front direction is refracted so as to be collected inward, opposite to the arrows in the left pixel in FIG. 7. However, even when the refractive index of the light transmissive layer LT is smaller, the emitted light propagates so as to spread outward after being collected inward. In any case, therefore, the light emitted in the front direction propagates so as to spread outward, thereby improving a viewing angle.

As a step of processing the light transmissive layer LT shown in FIG. 7, the light transmissive layer LT may be formed by an inkjet method, in which conditions are appropriately set.

Moreover, a first common electrode C1 may be semi-transmissive/semi-reflective, extremely thin metal (e.g., silver, Mg, MgAg, etc.), and the second common electrode C2 may be a transparent metal oxide film of ITO or the like. With this configuration, the microcavity effect is promoted between the pixel electrode P1 and the first common electrode C1, while the microcavity effect is suppressed between the first common electrode C1 and the second common electrode C2. Since the light transmissive layer LT has a lens shape, it is desirable to suppress the microcavity effect between the first common electrode C1 and the second common electrode C2. This is similar to the content described in the second embodiment, and the configuration of a color filter layer CF and the configuration of an organic electroluminescence element OL are also similar to those described in the second embodiment.

The light-emitting display device 1 in the third embodiment differs from the light-emitting display device 1 in the first embodiment in the respects described above. However, the light-emitting display device 1 in the third embodiment has substantially similar configurations except for the respects, and a description of the configurations substantially similar to those of the first embodiment is omitted.

Fourth Embodiment

Next, a light-emitting display device 1 of a fourth embodiment of the invention will be described with reference to FIG. 8. The fourth embodiment differs from the light-emitting display device 1 of the first embodiment in that a light transmissive layer LT is formed of a color resist and functions as a color filter.

Figure 8:
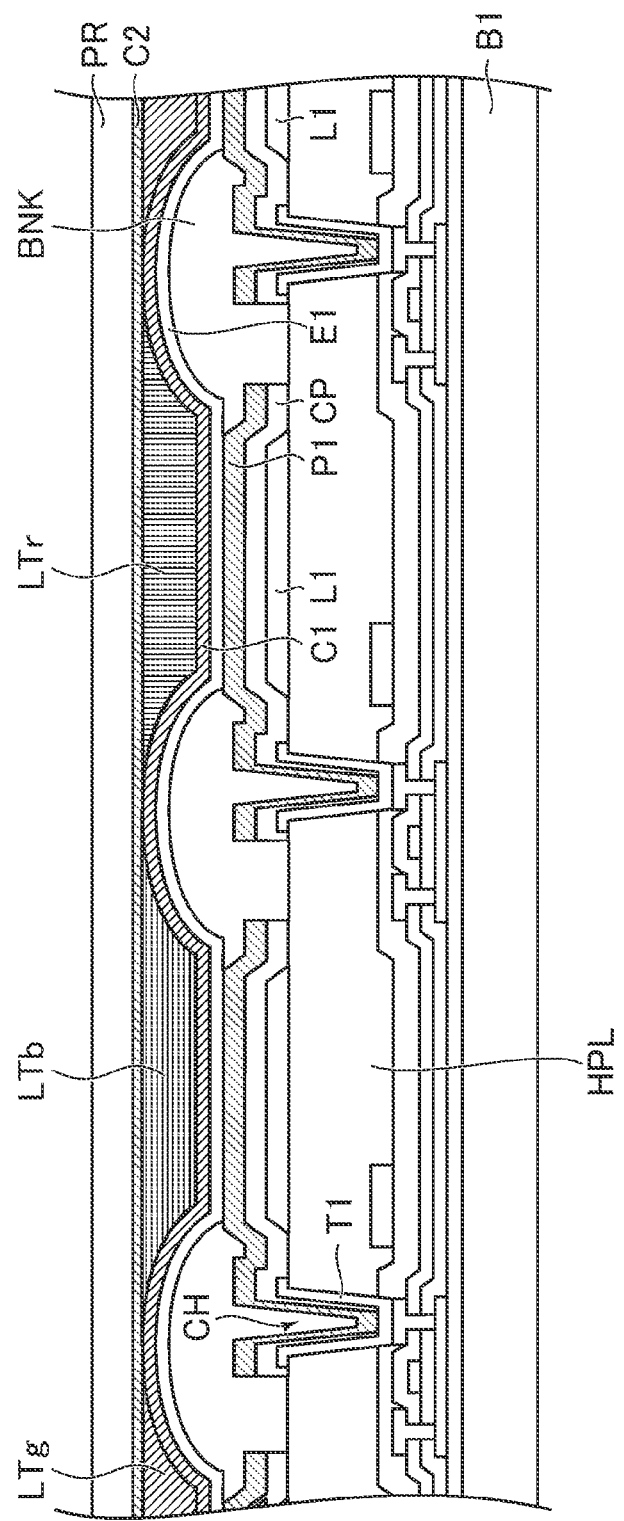
FIG. 8 is a cross-sectional view for explaining one pixel of a light-emitting display device in a fourth embodiment.

As shown in FIG. 8, a blue light transmissive layer LTb, a red light transmissive layer LTr, and a green light transmissive layer LTg are disposed between a first common electrode C1 and a second common electrode C2, and coloring is performed in the vicinity of the light-emitting layer E1. Since the light transmissive layers LTr, LTb, and LTg, which function as color filters as described above and through which lights in different wavelength ranges pass, are disposed, the occurrence of color mixture is reduced, and also, a second substrate B2 can be omitted. Therefore, a low-cost light-emitting display device can be realized.

The light-emitting display device 1 in the fourth embodiment differs from the light-emitting display device 1 in the first embodiment in the respects described above. However, the light-emitting display device 1 in the fourth embodiment has substantially similar configurations except for the respects, and a description of the configurations substantially similar to those of the first embodiment is omitted.

Fifth Embodiment

Next, a light-emitting display device 1 of a fifth embodiment will be described with reference to FIG. 9. In the light-emitting display device 1 of the first embodiment, the light-emitting layer E1 is formed so as to be common to the plurality of pixels, and the light-emitting layer E1 emits light of a single color (emits light including lights that pass through the multiple colors of color filters CF). However, the fifth embodiment differs in that light-emitting layers E1 are individually formed in the plurality of pixels, and that the light-emitting layers E1 are separately colored so as to each emit light in any of the multiple colors.

Figure 9:
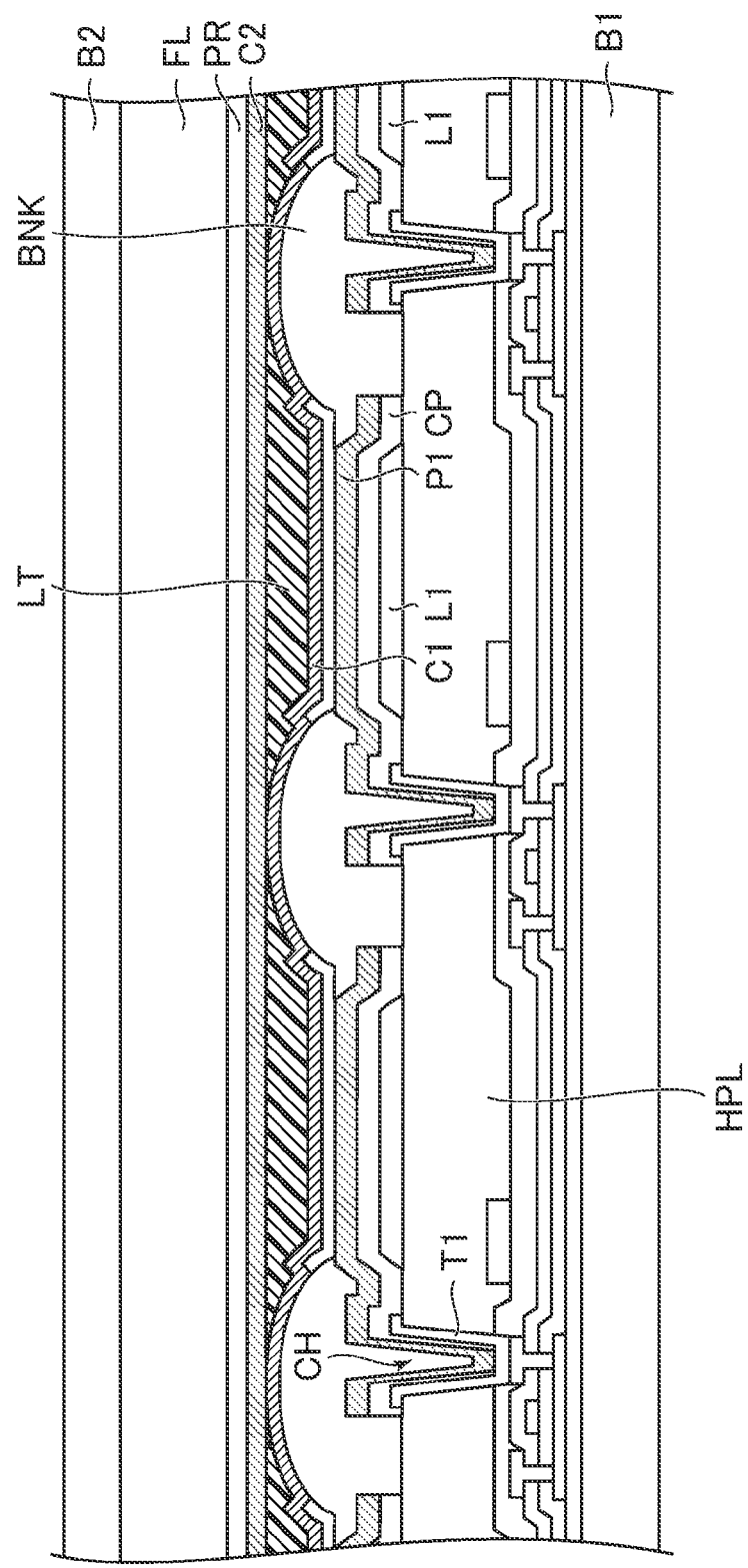
FIG. 9 is a cross-sectional view for explaining one pixel of a light-emitting display device in a fifth embodiment.

In a second substrate B2 in FIG. 9, a color filter including colored layers through which lights in different wavelength ranges pass, and a black matrix may be formed. Further, as described in the second embodiment, a first common electrode C1 may be semi-transmissive/semi-reflective, extremely thin metal, and a second common electrode C2 may be a transparent metal oxide film of ITO or the like. With this configuration, the microcavity effect is promoted between the pixel electrode P1 and the first common electrode C1, while the microcavity effect is suppressed between the first common electrode C1 and the second common electrode C2. Since the light transmissive layer LT has a lens shape, it is desirable to suppress the microcavity effect between the first common electrode C1 and the second common electrode C2. This is similar to the content described in the second embodiment, and the configuration of a color filter layer CF and the configuration of an organic electroluminescence element OL are also similar to those described in the second embodiment.

The light-emitting display device 1 in the fifth embodiment differs from the light-emitting display device 1 in the first embodiment in the respects described above. However, the light-emitting display device 1 in the fifth embodiment has substantially similar configurations except for the respects, and a description of the configurations substantially similar to those of the first embodiment is omitted.

In the light-emitting display device 1 in each of the embodiments, the first common electrode C1 and the second common electrode C2 are formed in a solid shape so as to be common to the plurality of pixels. However, the invention is not necessarily limited to the aspect described above.

Semi-transmissive/semi-transparent metal may be used for one of the first common electrode C1 and the second common electrode in the first embodiment to promote the microcavity effect.

The light-emitting display device in the embodiments is not limited to an organic EL display device, and may be a display device including a light-emitting element such as a quantum-dot light-emitting element (quantum-dot light-emitting diode (QLED)) in each of pixels.

In the first embodiment, the structures CT1 to CT4 dividing the planarization film HPL and the bank layer BNK are disposed, and the organic insulating film is filled between the two layers of inorganic insulating films so as to be buried in the voids occurring in the sealing layer PR due to these structures. However, it is needless to say that the invention is not limited to the aspect described above. The structures CT1 to CT4 may not be present, or the organic insulating film may not be included in the sealing layer PR.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a substrate;
   a plurality of pixel electrodes on the substrate, the plurality of pixel electrodes corresponding to a plurality of unit pixels constituting an image, the plurality of pixel electrodes being light-reflective;
   an insulating layer provided so as to overlie peripheral edge portions of the plurality of pixel electrodes;
   a light-emitting layer stacked on the plurality of pixel electrodes so as to be in contact with each of the plurality of pixel electrodes;
   a first common electrode stacked on the light-emitting layer so as to be in contact therewith above each of the plurality of pixel electrodes, the first common electrode being provided so as to overlie the insulating layer;
   a light transmissive layer stacked on the first common electrode above the plurality of pixel electrodes, the light transmissive layer avoiding stacking thereof on a portion of the first common electrode above the insulating layer; and
   a second common electrode stacked on the light transmissive layer above the plurality of pixel electrodes and stacked on the first common electrode so as to be in contact therewith above the insulating layer, the second common electrode being optically transparent,
   wherein light generated in the light-emitting layer reflects on the plurality of pixel electrodes and travels through the second common electrode in a direction away from the substrate.

2. The display device according to claim 1, wherein the light transmissive layer includes an upper surface on which the second common electrode is stacked, and the upper surface is flat.

3. The display device according to claim 1, wherein the light transmissive layer is an organic film and includes an upper surface on which the second common electrode is stacked, and
   the upper surface includes, above each of the plurality of pixel electrodes, a convex area that is convex in a direction of the second common electrode or a concave area that is concave in the direction.

4. The display device according to claim 3, further comprising:
   a sealing layer stacked above the second common electrode so as to seal the light-emitting layer; and
   a filling layer made of a material having a refractive index different from the light transmissive layer and stacked above the sealing layer, wherein
   the filling layer refracts light that is emitted vertically from the light-emitting layer and incident on the convex area or the concave area, so as to be collected or spread out.

5. The display device according to claim 1, further comprising a color filter layer including multiple colors of colored layers through which lights in different wavelength ranges pass, wherein
   the light-emitting layer emits light including the lights passing through the multiple colors of colored layers.

6. The display device according to claim 1, wherein
   the light transmissive layer includes multiple colors of colored layers through which lights in different wavelength ranges pass, and
   the light-emitting layer emits light including the lights passing through the multiple colors of colored layers.

7. The display device according to claim 1, wherein the light transmissive layer blocks ultraviolet rays and transmits visible light rays.

8. The display device according to claim 1, wherein the first common electrode is thinner than the second common electrode.

9. The display device according to claim 8, wherein the first common electrode is a metal film capable of transmitting light, and
   the second common electrode is a transparent metal oxide film.

10. The display device according to claim 9, wherein the thickness of the light-emitting layer that performs green light emission is thinner than the thickness of the light-emitting layer that performs red light emission, and
    the thickness of the light-emitting layer that performs blue light emission is thinner than the thickness of the light-emitting layer that performs green light emission.

* * * * *